(12) United States Patent
Cho

(10) Patent No.: US 7,068,549 B2
(45) Date of Patent: Jun. 27, 2006

(54) CIRCUIT FOR GENERATING DATA STROBE SIGNAL IN SEMICONDUCTOR DEVICE AND METHOD THEREOF

(75) Inventor: Ho Youb Cho, Seoul (KR)

(73) Assignee: Hynix Semiconductor, Inc., Kyungki-Do (KR)

( * ) Notice: Subject to any disclaimer, the term of this patent is extended or adjusted under 35 U.S.C. 154(b) by 31 days.

(21) Appl. No.: 10/878,755

(22) Filed: Jun. 28, 2004

(65) Prior Publication Data

US 2005/0128825 A1  Jun. 16, 2005

(30) Foreign Application Priority Data

Dec. 15, 2003  (KR) .................. 10-2003-0091646

(51) Int. Cl.
*G11C 7/00* (2006.01)
(52) U.S. Cl. ..................................... 365/193
(58) Field of Classification Search ................. 365/193
See application file for complete search history.

(56) References Cited

U.S. PATENT DOCUMENTS 6,680,866 B1 * 1/2004 Kajimoto ............... 365/189.01
6,768,698 B1 * 7/2004 Kono ......................... 365/233

* cited by examiner

*Primary Examiner*—Thong Q. Le
(74) *Attorney, Agent, or Firm*—Marshall, Gerstein & Borun LLP

(57) ABSTRACT

Provided is directed to a circuit for generating a DQS signal in a semiconductor memory device which includes: a DQS data generation unit for generating a DQS preamble signal and a DQS data, signals earlier than a CAS latency; a DQS output control signal generation unit for generating a control signal to drive the DQS preamble signal out before the CAS latency and to drive the DQS data out after the CAS latency; a DQS driver for driving the DQS preamble signal and a rising data of the DQS data from the DQS data generation unit according to a rising clock of the DQS output control signal generation unit, and driving a falling data from the DQS data generation unit according to a falling clock of the DQS output control signal generation unit.

13 Claims, 4 Drawing Sheets

CIRCUIT FOR GENERATING DATA STROBE SIGNAL IN SEMICONDUCTOR DEVICE AND METHOD THEREOF

This application relies for priority upon Korean Patent Application No. 2003-0091646 filed on Dec. 12, 2003, the contents of which are herein incorporated by reference in their entirety.

BACKGROUND

1. Field of the Invention

The present invention relates to a circuit of generating a data strobe DQS signal in a semiconductor memory device and a method of generating the same, and more particularly to, a circuit of generating a DQS signal and a method of generating the same capable of generating a DQS signal with one clock of preamble time at any time, regardless of process, voltage, temperature PVT, and operation frequency, by identifying paths of both a DQS preamble signal and a DQS output control signal.

2. Discussion of Related Art

In general, a synchronous semiconductor memory device such as a double data rate DDR SDRAM transfers data to a chip-set according to a DQS signal. Therefore, a timing of the DQS signal is very important.

FIG. 1 is a circuit diagram illustrating a circuit of generating a DQS signal in a semiconductor memory device of the conventional art, which will be described about the operation thereof with reference to FIG. 2.

Referring to FIG. 2, a DQS signal generation circuit in a semiconductor memory device of the conventional art is comprised of a DQS pre-signal generation unit 10, a DQS data generation unit 20, a DQS output control signal generation unit 30, and a DQS signal driver 40.

The DQS pre-signal generation unit 10 generates a signal for assuring a preamble time (tRPRE in FIG. 2) of the DQS. The DQS data generation unit 20 generates a DQS data. The DQS output control signal generation unit 30 generates a signal for transferring the DQS data to a DQS pad 50. The DQS driver 40 drives the DQS signal to have a constant level.

With reference to the DQS pre-signal generation unit 10, after inputting a read command, a high state preamble control signal qsen_pre is generated, as shown in FIG. 2, before one clock of CAS latency.

In case that the CAS latency doesn't include a decimal point, that is, the CAS latency is a constant such as 2, 3, 4, clx5 is a low state, which leads a transmission gate T2 to be turned on. In response to this, an internal rising clock rclk_dll is inverted by a NAND gate G1. An output of the NAND gate G1 is delayed in a delay unit comprised of inverters I1 to I5 after passing through a NOR gate G2. An output of the delay unit is inverted and then becomes a DQS pre-signal qspre_clk in a low state, as shown in FIG. 2.

In case that the CAS latency includes a decimal point, that is, the CAS latency is like 1.5, 2.5, clx5 is a high state, which leads the transmission gate T1 to be turned on. In response to this, an internal falling clock fclk_dll is inverted by the NAND gate G1. The output of the NAND gate G1 is delayed in the delay unit comprised of inverters I1 to I5 after passing through the NOR gate G2. The output of the delay unit is inverted and then becomes the DQS pre-signal qspre_clk in a low state, as shown in FIG. 2.

A delay value of the delay unit is decided by switches sw1 to sw4, and the DQS pre-signal generation unit 10 is enabled or disabled according to an option signal opt.

The DQS data generation unit 20 generates a DQS data toggling to a high or a low state. For instance, when the CAS latency includes a decimal point, clx5 becomes a low state, which leads transmission gates T3, T5 to be turned on. In response to this, an output rdo receives a high data, while another output fdo receives a low data.

For instance, when the CAS latency doesn't include a decimal point, clx5 become a low state, which leads the transmission gates T3, T5 to be turned on. As a result of this, the output rdo receives a high data, while the output fdo receives a low data.

The DQS output control signal generation unit 30 generates a control signal for driving the DQS data out after the CAS latency.

A NAND gate G3 combines a rising data enable signal routen and an internal rising clock rclk_dll, and then the output of the NAND gate G3 is inverted therein by an inverter. As a result, a first control signal rclk_do is generated. A NAND gate G4 combines a falling data enable signal fouten and an internal falling clock fclk_dll and then the output of the NAND gate G4 is inverted therein by an inverter. As a result, a second control signal fclk_do is generated.

The first control signal rclk_do is a control signal to drive a rising data of the DQS data out, while the second control signal fclk_do is a control signal to drive a falling data of the DQS data out.

The DQS driver 40 is comprised of a first driver 40A and a second driver 40B.

A PMOS transistor Q1 is turned on according to the output qspre_clk of the DQS pre-signal generation unit 10, and thus stored a high data in a latch 60. A NMOS transistor Q2 is turned on according to a signal inverted by an inverter 18, and thus the DQS is driven from a high impedance state to a low state.

The DQS data generated from the DQS data generation unit 20 is outputted to the DQS pad 50 by turns for a high state and a low state according to the control signals from the DQS output control signal generation unit 30, which will be explained in detail as follows.

The first driver 40A and the second driver 40B have a similar configuration except the scheme of the PMOS transistor Q1 in the second driver 40B. Therefore, there will not be another explanation of the same section.

For reference, a control signal qsen is to turn on or off the DQS driver. Moreover, an option signal opt is to select a DQS buffer in case of including a plurality of DQS buffers. That is, in a semiconductor memory device comprised of x4/x8/x16, it is divided into an upper DQS and a lower DQS. During this, the two of the DQS are all operated in x16, while the upper DQS is only operated in x4/x8.

For instance, in case that the output rdo of the DQS data generator is a high state and the output fdo, as shown in FIG. 2, is a low state, when the first control signal rclk_do of the DQS control signal generation unit 30 in risen to a high state, an output of a NAND gate G5 becomes a low state. Therefore, transistors Q4, Q5 are turned on, and thus a node K2 becomes a high state. As an output of a latch 70 is a low state, a PMOS transistor Q6 is turned on but a NMOS transistor Q2 is turned off. Accordingly, the DQS is risen to a high level.

Then, as shown in FIG. 2, when the second control signal fclk_do of the DQS control signal generation unit 30 is risen to a high state, an output of a NAND gate G6 becomes a low state. Accordingly, NMOS transistors Q7, Q8 are turned on, and thus the node K2 becomes a ground potential. As the node K2 is the ground potential, the output of the latch 70 becomes a high state.

The PMOS transistor Q6 is turned off, while the NMOS transistor Q2 is turned off. As a result, the DQS is fallen down from a high state to a low state.

Repeating these operations, the DQS signal is generated, as shown in FIG. 2.

As aforementioned, in the conventional art, the DQS preamble signal is transited from a high impedance state to a low state by a preamble signal path (A in FIG. 1).

On the other hand, the DQS data is transited from a low state to a high state by a DQS output control signal path (B in FIG. 1).

That is, there are two different paths for the DQS outputted according to the output qspre_clk of the DQS pre-signal generation unit 10 and the DQS outputted according to outputs rclk_do, fclk_do of the DQS control signal generation unit 30, and preamble time tRPRE of the two DQS is deviated, because the delay values by PVT of the two paths are different.

SUMMARY OF THE INVENTION

The present invention is directed to provide a circuit of generating a DQS signal in a semiconductor memory device and a method thereof capable of generating a DQS signal having one clock of preamble time at any time, regardless of process, voltage, and temperature PVT, and also regardless of operation frequency, by identifying a path of a DQS preamble signal and a path of a DQS output control signal.

One aspect of the present invention is to provide a DQS signal generation circuit in a semiconductor memory device which comprises: a DQS data generation unit for generating a DQS preamble signal and a DQS data earlier than a CAS latency; a DQS output control signal generation unit for generating a control signal to drive the DQS data out after the CAS latency; and a DQS driver for driving the DQS preamble signal and a rising data of the DQS data from the DQS data generation unit according to a rising clock of the DQS output control signal generation unit, and driving a falling data from the DQS data generation unit according to a falling clock of the DQS output control signal generation unit.

A method of generating a DQS signal in a semiconductor memory device in accordance with the present invention includes the steps of: loading a DQS preamble signal, as a signal one clock as early as a CAS latency and a DQS data toggling from after the CAS latency on the same output line; generating a control signal for driving the DQS preamble signal out one clock earlier than the CAS latency and driving the DQS data out after the CAS latency; and driving the DQS preamble signal and a rising data of the DQS data from the DQS data generation according to a rising clock of the DQS output control signal generation unit, and driving a falling data of the DQS data from the DQS data generation unit according to a falling clock of the DQS output control signal generation unit.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments of the present invention with reference to the accompanying drawings in detail.

Figure 1:
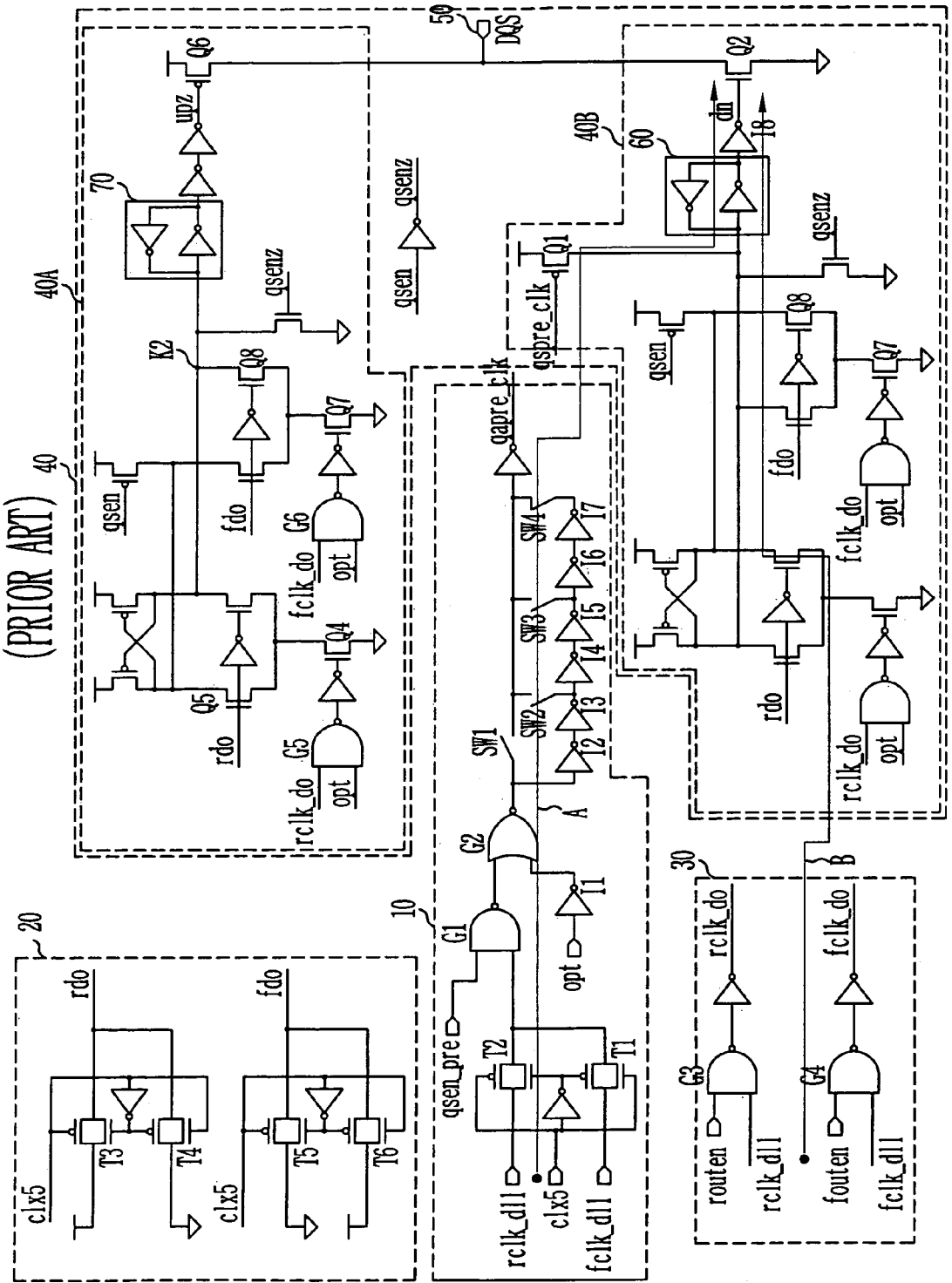
FIG. 1 is a circuit diagram illustrating a circuit of generating a DQS signal in a semiconductor memory device of the conventional art.
Figure 2:
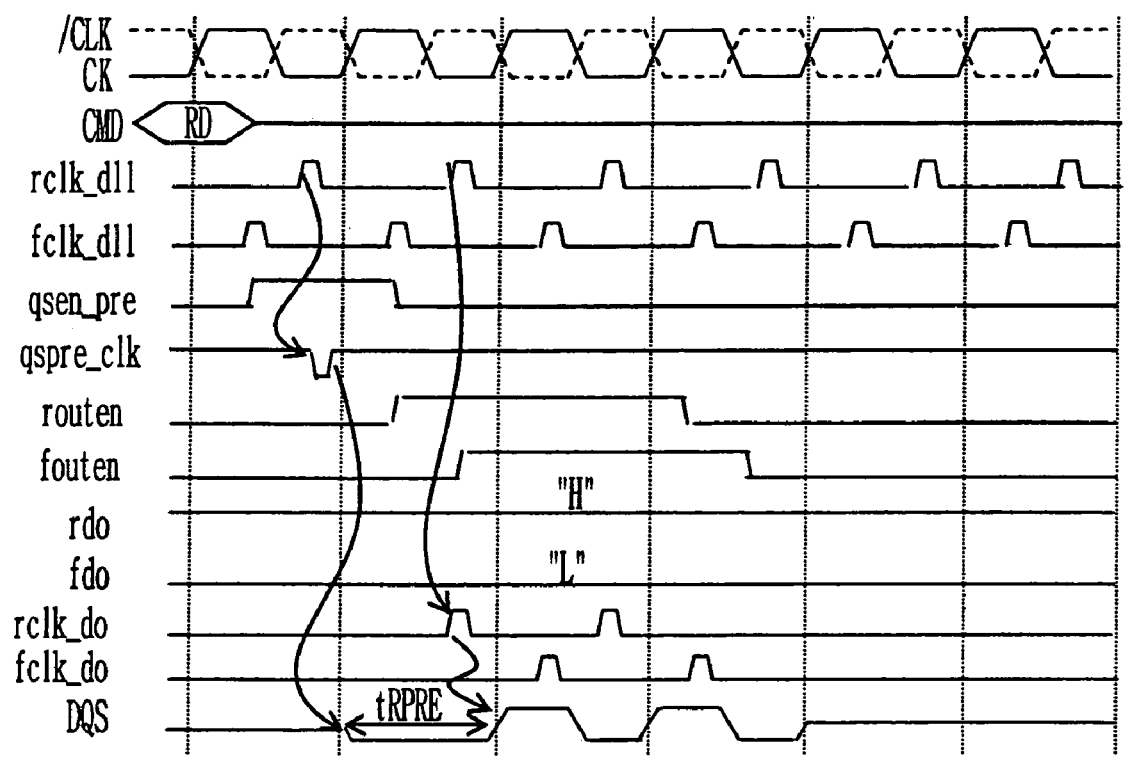
FIG. 2 is a waveform diagram illustrating an operation of the circuit in FIG. 1.
Figure 3:
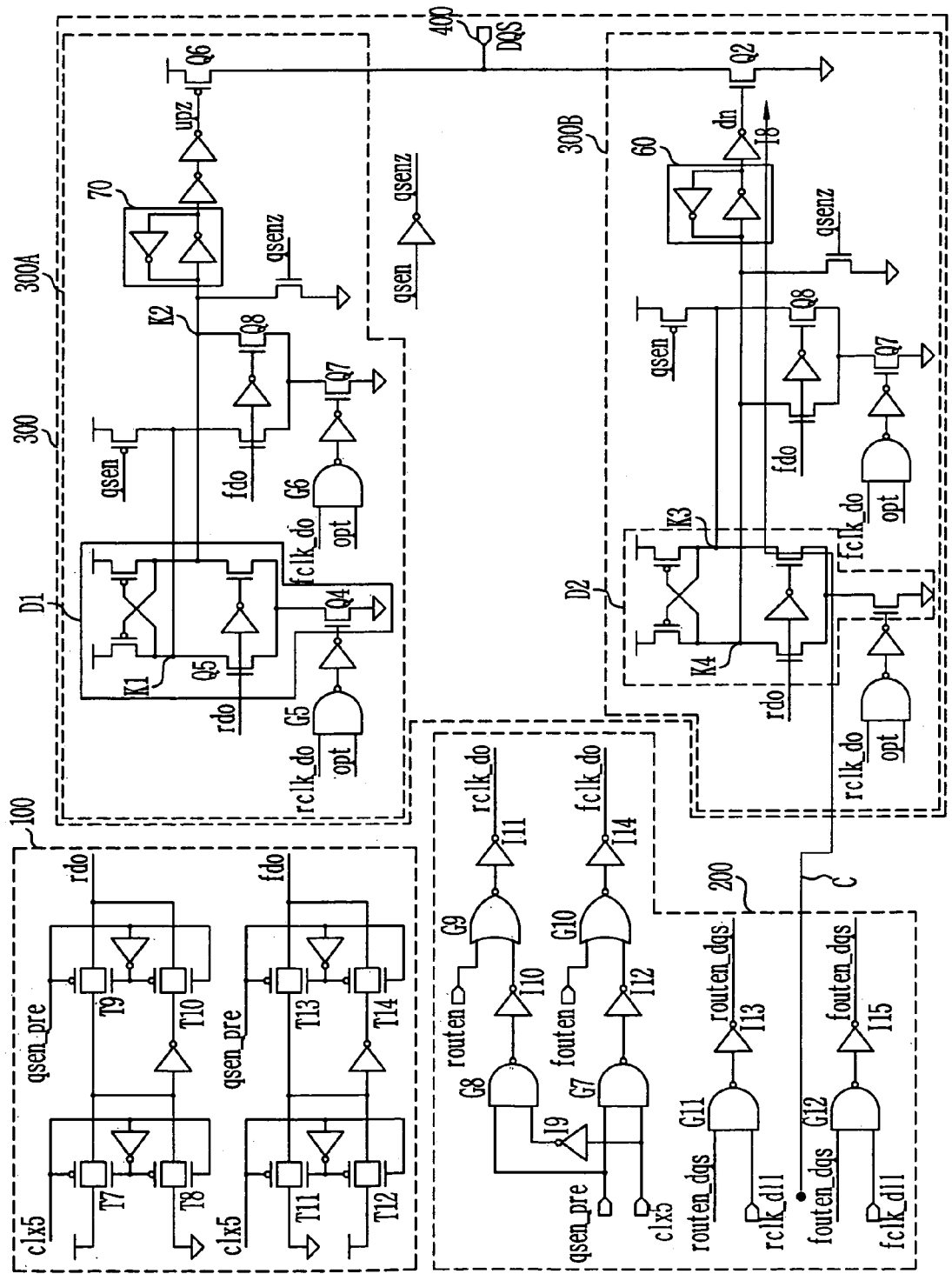
FIG. 3 is a circuit diagram illustrating a circuit of generating a DQS signal in a semiconductor memory device in accordance with the present invention.

FIG. 3 is a circuit diagram illustrating a DQS signal generation circuit in a semiconductor memory device in accordance with the present invention, which will be explained with reference to FIG. 4 in detail.

The DQS signal generation circuit in the semiconductor memory device in accordance with the present invention is comprised of a DQS data generation unit 100, a DQS output control signal generation unit 200, and a DQS driver 300.

The DQS data generation unit 100 generates a DQS preamble signal (a signal one clock earlier than a CAS latency) and a DQS data. The DQS preamble signal is generated before one clock of the CAS latency after operating a read command RD, when a control signal qsen_pre, as shown in FIG. 4, is a high state.

In case that the CAS latency includes a decimal point, clx5 becomes a high state, while becoming a low state in case that the CAS latency is a constant without including a decimal point.

When clx5 is a high state, transmission gates T8, T12 are turned on, and when clx5 is not a high state, transmission gates T7, T11 are turned on.

DQS Preamble Signal Generation

When the preamble signal is a high state, transmission gates T10, T14 are turned on. Therefore, when the CAS latency includes a decimal point, the DQS preamble signal in a high state is loaded on a first output rdo through the transmission gates T8, T10. On the other hand, when the CAS latency doesn't include a decimal point, the DQS preamble signal in a low state is loaded on the first output rdo through the transmission gates T7, T10.

Additionally, when the CAS latency includes a decimal point, the DQS preamble signal in a low state is loaded on an second output fdo through the transmission gates T12, T14. On the other side, when the CAS latency doesn't include a decimal point, the DQS preamble signal in a high state is loaded on the second output fdo through the transmission gates T11, T14.

Figure 4:
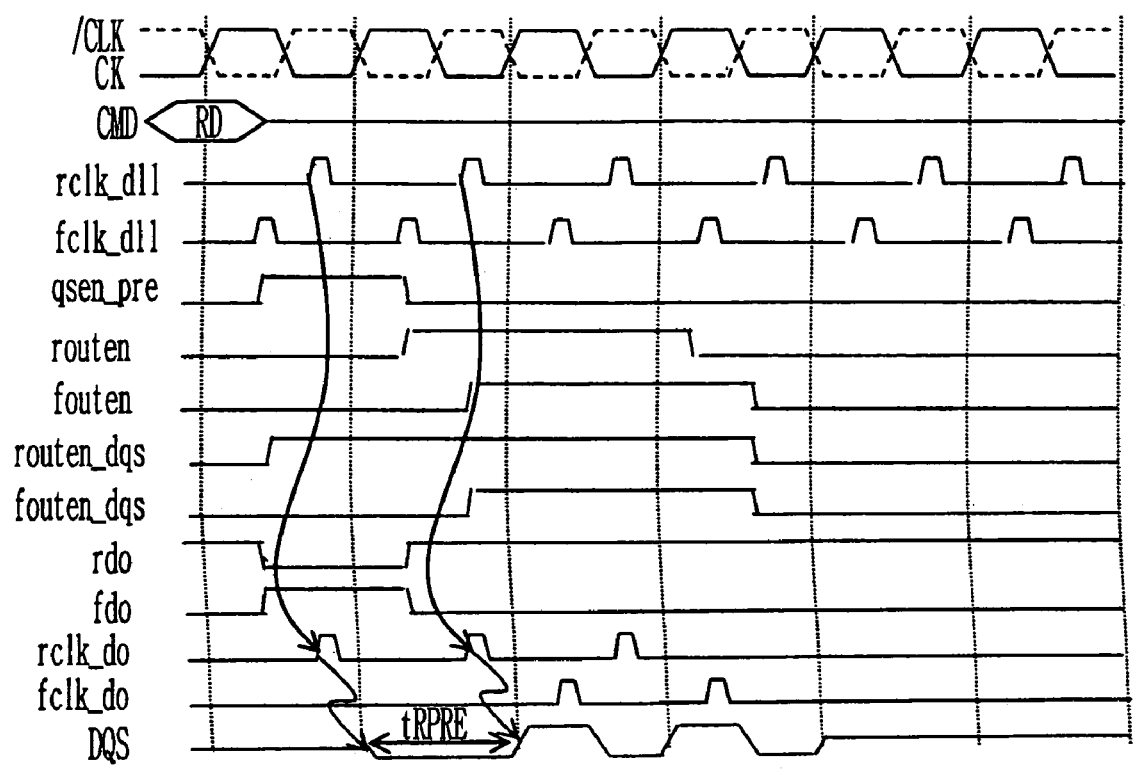
FIG. 4 is a waveform diagram illustrating an operation of the circuit in FIG. 3.

Referring to FIG. 4, the DQS preamble signal is loaded with a high state on the first output rdo, while being loaded with a low state on the second output fdo.

DQS Data Generation

The DQS data is generated when the preamble control signal qsen_pre is a low state.

When the preamble control signal qsen_pre is a low state, the transmission gates T9, T13 are turned on. Accordingly, when the CAS latency includes a decimal point, the DQS data in a high state is loaded on the first output rdo but when the CAS latency doesn't include a decimal point, the DQS data in a low state is loaded on the first output rdo through the transmission gates T7, T10

Furthermore, when the CAS latency includes a decimal point, the DQS data in a low state is outputted through the second output fdo, but when the CAS latency doesn't include a decimal point, the DQS data in a high state is outputted through the second output fdo.

Still referring to FIG. 4, after generating the DQS preamble signal, the DQS data in a high state is loaded on the first output rdo, while the DQS data in a low state is loaded on the second output fdo.

The DQS output control signal generation unit 200 generates a control signal for driving the DQS preamble signal out one clock earlier than the CAS latency, and a control signal for driving the DQS data out after the CAS latency.

1) Generating a Control Signal for Driving the DOS Preamble Signal Out One Clock Earlier than the CAS Latency When the CAS latency doesn't include a decimal point, that is, in case that clx5 is a low state, an output of an inverter I9 is a high state, and thus the preamble control signal qsen_pre is inverted by a NAND gate G8 and then outputted. An output of a NAND gate G9 is inverted by an inverter I10. A NOR gate G9 combines the preamble control signal qsen_pre and a DQS rising data enable signal routen. The output of the NOR gate G9 is inverted by an inverter I11 and then loaded on a rising enable output routen_dqs. A NAND gate G11 combines the rising enable output routen_dqs and an internal rising clock rclk_dll. An output of the NAND gate G11 is inverted by an inverter I13, and then loaded on a first control signal rclk_do output terminal.

On the other hand, clx5 and the preamble control signal qsen_pre are inputted to a NAND gate G7. An output of the NAND gate G7 is inverted by an inverter I12. A NOR gate G10 combines a DQS falling data enable signal fouten and an output of the inverter I12. An output of the NOR gate G10 is inverted by the inverter I12 and then loaded on a falling enable output fouten_dqs. A NAND gate G12 combines the falling enable output fouten_dqs and the internal falling clock fclk_dll. An output of the NAND gate G12 is inverted by an inverter I15, and then loaded on a second control signal fclk_do output terminal.

2) Generating a Control Signal for Driving the DQS Data Out After the CAS Latency As clx5 is a low state and the preamble control signal qsen_pre is a low state, the NOR gate G9 inverts the DQS rising data enable signal routen and then outputs it. An output of the NOR gate G9 is inverted by the inverter I11 and then loaded on the rising enable output routen_dqs.

The NAND gate G11 combines the rising enable output routen_dqs and the internal rising clock rclk_dll. An output of the NAND gate G11 is inverted by the inverter I13 and then loaded on the first control signal rclk_do output terminal.

As clx5 is a low state and the preamble control signal qsen_pre is a low state, a NOR gate G10 inverts the DQS falling data enable signal fouten and then outputs it. An output of the NOR gate G10 is inverted by the inverter I14 and then loaded on the falling enable output fouten_dqs.

The NAND gate G12 combines the falling enable output fouten_dqs and the internal falling clock fclk_dll. An output of the NAND gate G12 is inverted by the inverter I15 and then loaded on the second control signal fclk_do output terminal.

The first control signal rclk_do is a control signal for driving out the DQS preamble signal and the rising data of the DQS data, while the second control signal fclk_do is a control signal for driving out the DQS preamble signal and the falling data of the DQS data.

The DQS driver 300 is comprised of a first driver 300A and a second driver 300B. The first and second drivers 300A, 300B have a similar configuration, so that there will not be another explanation of the same section.

For reference, a control signal qsen is a signal for turning on or off the DQS driver. Further, an option signal opt is a signal for selecting a DQS buffer when including a plurality of DQS buffers. That is, in a semiconductor memory device comprised of x4/x8/z16, it is divided into an upper DQS and a lower DQS. Here, two of the DQS are all operated in x16, while one DQS is only operated in x4/x8.

The preamble signal and the rising data of the DQS data loaded on the first output rdo in the DQS data generation unit 100 are driven by the first control signal rclk_do of the DQS output control signal generation unit 200.

The falling data of the DQS data loaded on the second output fdo in the DQS data generation unit 100 is driven by the second control signal fclk_do of the DQS output control signal generation unit 200.

When the first output rdo of the DQS data generation unit 100 is transited from a high state to a low state and the first control signal rclk_do of the DQS data output control signal generation unit 200 is risen to a high state, differential amplifiers D1, D2 are operated. Therefore, a node K2 becomes a low state and a node K4 becomes a high state. In response to this, the PMOS transistor Q6 is turned off and the NMOS transistor Q2 is turned on. As a result, the DQS is transited from a high impedance to a low state, which result in deciding a preamble starting point of the DQS.

After setting the DQS preamble starting point, for instance, in case that the first output rdo of the DQS data generation unit 100 is a high state and the second output fdo is a low state, when the first control signal rclk_do of the DQS control signal generation unit 200 is risen to a high state, an output of the NAND gate G5 becomes a low state. Therefore, the transistors Q4, Q5 are turned on, and thus the node K2 becomes a high state. An output of the latch 70 in the first driver 300A becomes a low state, while an output of the latch 60 in the second driver 300B becomes a high state. As a result of this, the PMOS transistor Q6 is turned on, while the NMOS transistor Q2 is turned off. Accordingly, the DQS is rising to a high level.

Then, as shown in FIG. 4, the second control signal fclk_do of the DQS control signal generation unit 200 is risen to a high state, an output of the NAND gate G6 becomes a low state. Accordingly, the NMOS transistors Q7, Q8 are turned on, and thus the node K2 becomes a ground potential. An output of the latch 70 in the first driver 300A becomes a high state, while an output of the latch 60 in the second driver 300B becomes a low state. The PMOS transistor Q6 is turned off, while the NMOS transistor N2 is turned on. As a result, the DQS is falling down from a high level to a low level. Repeating those operations, as shown in FIG. 4, the DQS signal is generated.

As aforementioned, it is available to output data to one clock base by driving the DQS preamble signal out by the DQS preamble clock (a signal one clock earlier than the CAS latency) and driving the DQS data out by the DQS clock (a clock corresponding to the CAS latency) through the identical path (path C in FIG. 3).

As describe above, the present invention is advantageous to generate the DQS signal having one clock of preamble time at any time regardless of process, voltage, temperature PVT and also regardless of operation frequency, by identifying the paths of the DQS preamble signal and the DQS output control signal.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A circuit for generating a DQS signal in a semiconductor memory device, comprising:
   a DQS data generation unit for generating a DQS preamble signal earlier than a CAS latency and generating a DQS data after generating the DOS preamble signal, according to a preamble control signal;
   a DQS output control signal generation unit for generating a control signal to drive the DQS preamble signal output before the CAS latency and to drive the DQS data out after the CAS latency; and
   a DQS driver for driving the DQS preamble signal and a rising data of the DQS data from the DQS data generation unit according to a rising clock of the DQS output control signal generation unit, and driving a falling data of the DQS data from the DQS data generation unit according to a falling clock of the DQS output control signal generation unit.

2. The circuit for generating a DQS signal in a semiconductor memory device of claim 1, wherein the DQS data generation unit generates a DQS preamble signal when the preamble control signal is a high state and generates the DQS data when the preamble control is a low state.

3. The circuit for generating a DQS signal in a semiconductor memory device of claim 1, wherein the DQS data output control signal generation unit includes:
   a first combination circuit for combining a preamble control signal and a signal for enabling the rising data of the DQS data according to the CAS latency;
   a second combination circuit for generating a control signal for driving a falling data of the DQS preamble signal and a rising data of the DQS data, by combining an output of the first combination circuit and an internal rising clock signal;
   a third combination circuit for combining the preamble control signal and a signal for enabling the falling data of the DQS data according to the CAS latency; and
   a fourth combination circuit for generating a clock to drive out the falling data of the DQS data by combining an output of the third combination circuit and the internal falling clock.

4. The circuit for generating a DQS signal in a semiconductor memory device of claim 1, wherein the DQS driver includes first and second drivers, and a potential of a DQ pad is rising by an output of the first driver and a potential of the DQ pad is falling down by an output of the second driver.

5. The circuit for generating a DQS signal in a semiconductor memory device of claim 4, wherein the first driver includes:
   a differential amplifier for generating first and second logic signal by differentially amplifying the rising data of the DQS generation unit by being enabled according to the rising clock from the DQS output control signal generation unit; and
   a control circuit for making the first and second logic signals a ground level by being enabled according to the falling clock from the DQS output control signal generation unit;
   a pull-up transistor for rising the potential of the DQ pad according to the second logic signal.

6. The circuit for generating a DQS signal in a semiconductor memory device of claim 4, wherein the second driver includes:
   a differential amplifier for generating first and second logic signals by differentially amplifying the rising data of the DQS generation unit by being enabled according to the rising clock from the DQS output control signal generation unit;
   a control circuit for making the first and second control signals a ground level by being enabled according to the falling clock from the DQS output control signal generation unit; and
   a pull-down transistor for falling down the potential of the DQ pad according to the third logic signal.

7. The circuit for generating a DQS signal in a semiconductor memory device of claim 1, wherein the DQS data generation unit includes:
   a DQS data generation circuit for generating the DQS data in response to the CAS latency; and
   a DQS preamble signal generation circuit for generating the DQS preamble signal in response to the preamble control signal.

8. The circuit for generating a DQS signal in a semiconductor memory device of claim 7, wherein the DQS data generation circuit includes:
   a first transfer unit for transferring a power supply voltage or a ground voltage to a first output terminal of the DQS data generation circuit in response to the CAS latency; and
   a second transfer unit for transferring the power supply voltage or the ground voltage to a second output terminal of the DQS data generation circuit in response to the CAS latency.

9. The circuit for generating a DQS signal in a semiconductor memory device of claim 8, wherein the first transfer unit includes:
   a first transfer gate for transferring the power supply voltage to the first output terminal of the DQS data generation circuit in response to the CAS latency; and
   a second transfer gate for transferring the ground voltage to the first output terminal of the DQS data generation circuit in response to the CAS latency,
   wherein one of the first and the second transfer gate is operated in response to the CAS latency.

10. The circuit for generating a DQS signal in a semiconductor memory device of claim 8, wherein the second transfer unit includes:
    a first transfer gate for transferring the power supply voltage to the second output terminal of the DQS data generation circuit in response to the CAS latency; and
    a second transfer gate for transferring the ground voltage to the second output terminal of the DQS data generation circuit in response to the CAS latency,
    wherein one of the first and the second transfer gate is operated in response to the CAS latency.

11. The circuit for generating a DQS signal in a semiconductor memory device of claim 8, wherein the DQS preamble signal generation circuit includes:
    a first transfer unit for transferring an output signal or a reversed output signal of the DQS data generation circuit to a first output terminal of the DQS preamble signal generation circuit in response to the preamble control signal; and
    a second transfer unit for transferring the output signal or the reversed output signal of the DQS data generation circuit to a second output terminal of the DQS preamble signal generation circuit in response to the preamble control signal.

12. The circuit for generating a DQS signal in a semiconductor memory device of claim 11, wherein the first transfer unit includes:
   a first transfer gate for transferring the output signal of the DQS data generation circuit to the first output terminal of the DQS preamble signal generation circuit in response to the preamble control signal; and
   a second transfer gate for transferring the reversed output signal of the DQS data generation circuit to the first output terminal of the DQS preamble signal generation circuit in response to the preamble control signal,
   wherein one of the first and the second transfer gate is operated in response to the preamble control signal.

13. The circuit for generating a DQS signal in a semiconductor memory device of claim 11, wherein the second transfer unit includes:
   a first transfer gate for transferring the output signal of the DQS data generation circuit to the second output terminal of the DQS preamble signal generation circuit in response to the preamble control signal; and
   a second transfer gate for transferring the reversed output signal of the DQS data generation circuit to the second output terminal of the DQS preamble signal generation circuit in response to the preamble control signal,
   wherein one of the first and the second transfer gate is operated in response to the preamble control signal.

* * * * *

UNITED STATES PATENT AND TRADEMARK OFFICE
CERTIFICATE OF CORRECTION

| | | |
|---|---|---|
| PATENT NO. | : 7,068,549 B2 | Page 1 of 1 |
| APPLICATION NO. | : 10/878755 | |
| DATED | : June 27, 2006 | |
| INVENTOR(S) | : Ho Y. Cho | |

It is certified that error appears in the above-identified patent and that said Letters Patent is hereby corrected as shown below:

In Claim 1, Col. 7 line 13, please delete "DOX" and insert --DQS--.

Signed and Sealed this

Ninth Day of January, 2007

JON W. DUDAS
*Director of the United States Patent and Trademark Office*